(12) United States Patent
Crippen et al.

(10) Patent No.: US 8,641,313 B1
(45) Date of Patent: Feb. 4, 2014

(54) LATCH FOR SECURING A COMPUTE NODE IN A COMPONENT STORAGE RACK

(75) Inventors: Martin J. Crippen, Apex, NC (US); Anthony F. Katsaros, Youngsville, NC (US); Brian M. Kerrigan, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/570,482

(22) Filed: Aug. 9, 2012

(51) Int. Cl.
*B25G 3/18* (2006.01)

(52) U.S. Cl.
USPC .................................. 403/322.1; 361/679.39

(58) Field of Classification Search
USPC .............. 403/321, 322.4, 325, 326, 108; 16/110.1, 412; 361/727, 755, 807, 810; 312/332.1, 319.1, 223, 333, 223.2; 292/80, 81, 84, 87, 303, 194, 195, 200, 292/DIG. 61
See application file for complete search history.

(56) References Cited

U.S. PATENT DOCUMENTS

| | | | | | |
|---|---|---|---|---|---|
| 613,970 | A | * | 11/1898 | Christy | 403/108 |
| 4,580,192 | A | * | 4/1986 | Beun | 361/736 |
| 4,818,003 | A | * | 4/1989 | Seko et al. | 292/336.3 |
| 5,456,135 | A | * | 10/1995 | Li | 74/551.7 |
| 6,147,872 | A | * | 11/2000 | Roy | 361/754 |
| 7,023,693 | B2 | * | 4/2006 | Yuan et al. | 361/679.39 |
| 7,097,380 | B2 | * | 8/2006 | Lee | 403/109.2 |
| 7,616,450 | B2 | | 11/2009 | Karstens | |
| 7,684,208 | B2 | | 3/2010 | Okamoto et al. | |
| 7,782,606 | B2 | * | 8/2010 | Baker et al. | 361/679.39 |
| 7,944,691 | B1 | * | 5/2011 | Pounds | 361/679.59 |
| 8,023,263 | B2 | | 9/2011 | Crippen et al. | |
| 8,238,091 | B2 | * | 8/2012 | Chang et al. | 361/679.39 |
| 8,248,775 | B2 | * | 8/2012 | Zhang et al. | 361/679.33 |

OTHER PUBLICATIONS

IBM TDB, "Method to Increase Surface Area for Microelectronic Applications", http://www.ip.com/pubview/IPCOM000015477D, Aug. 17, 2002, 7 Pages (Title Page and pp. 1-6).
"Method for personalized notebook chassis designs", http://www.ip.com/pubview/IPCOM000141646D, Oct. 11, 2006, 6 Pages.

* cited by examiner

*Primary Examiner* — Michael P Ferguson
*Assistant Examiner* — Daniel Wiley
(74) *Attorney, Agent, or Firm* — Katherine S. Brown; Jeffrey L. Streets

(57) ABSTRACT

A latch comprises a frame securable to an enclosure, and a handle pivotally secured to the frame for pivoting between a closed position and an open position. The distal end of the handle has a drive pin extending therefrom. The latch also comprises a pawl having a latch key, a distal end secured to the frame, and a proximal end coupled to the drive pin. Closing the handle causes the drive pin to move the pawl toward a side of the chassis bay and deploy the latch key into engagement with a slot in the side of the chassis bay. Opening the handle causes the drive pin to move the pawl away from a side of the chassis bay and withdraw the latch key out of engagement with the slot in the side of the chassis bay.

2 Claims, 5 Drawing Sheets

LATCH FOR SECURING A COMPUTE NODE IN A COMPONENT STORAGE RACK

BACKGROUND OF THE INVENTION

1. Field of the Invention

The present invention relates to a latch for securing a compute node in a component storage rack.

2. Background of the Related Art

A compute node generally includes electronic data processing and data storage components secured to a circuit board that is disposed within an enclosure. Several compute nodes may be supported in a chassis or rack. Typically, a compute node is adapted for network connection to a host system that communicates data to and from the compute node.

A plurality of compute nodes may be stored in a plurality of bays formed in a chassis or rack. This configuration enables a host computer to interface with numerous compute nodes. Each bay of the chassis or rack may include a connector to electronically dock with mating connectors on the compute node when secured within that bay. A compute node interface connector may be disposed at a leading end of a compute node, and the interface connector may plug into a mating connector positioned at the end of the bay.

During compute node installation, the leading end of the compute node is inserted into the mouth of the bay with the mating connector of the compute node aligned with the interface connector within the bay. As the compute node moves further into the bay, the connector on the compute node is coupled to the connector within the bay. The compute node may be secured in this interfaced position using a latch that prevents the compute node from being inadvertently displaced from the interfaced position during use.

BRIEF SUMMARY OF THE INVENTION

One embodiment of the invention provides a latch comprising a frame securable to a proximal end of a compute node enclosure, and a handle pivotally secured to the frame intermediate a proximal end of the handle and a distal end of the handle so that the handle can be pivoted between a closed position and an open position, wherein the distal end of the handle has a drive pin extending therefrom. The latch also comprises a pawl having a latch key, a distal end secured to the frame, and a proximal end coupled to the drive pin. Positioning the handle in the closed position causes the drive pin to move the proximal end of the pawl toward a side of the chassis bay and deploy the latch key beyond the frame and into engagement with a proximal end of a slot in the side of the chassis bay. Positioning the handle in the open position causes the drive pin to move the pawl away from a side of the chassis bay and withdraw the latch key out of engagement with the proximal end of the slot in the side of the chassis bay.

Another embodiment of the invention is a latch comprising a frame securable to a proximal end of a compute node enclosure, and a handle slidably secured to the frame, wherein the handle can slide between an inward position and an outward position, wherein the distal end of the handle has a drive pin extending therefrom. The latch further comprises a rigid pawl having a latch key, a distal end pivotally secured to the frame, and a slot that receives the drive pin. Inserting the handle from the outward position to the inward position causes the drive pin to move within the slot, push the proximal end of the pawl toward a side of the chassis bay, and deploy the latch key beyond the frame and into engagement with a proximal end of a slot in the side of the chassis bay. Withdrawing the handle from the inward position to the outward position causes the drive pin to move within the slot, pull the proximal end of the pawl away from a side of the chassis bay, and withdraw the latch key within the frame and out of engagement with the proximal end of the slot in the side of the chassis bay.

BRIEF DESCRIPTION OF THE APPENDED DRAWINGS

DETAILED DESCRIPTION OF THE INVENTION

Figure 1:
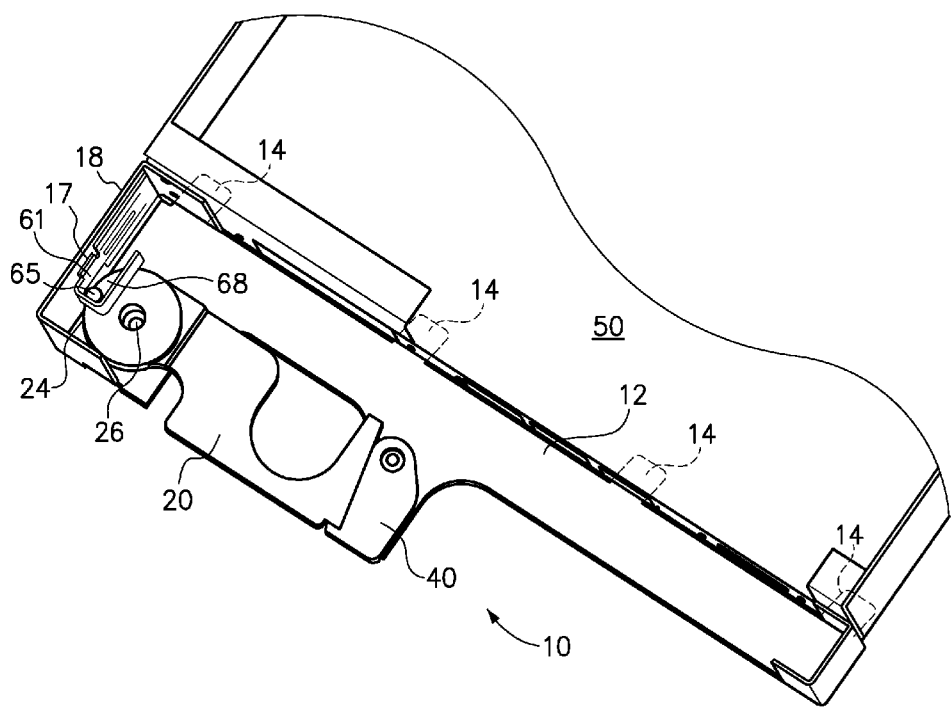
FIG. 1 is a perspective view of a first embodiment of the latch of the present invention having a spring-biased pawl coupled to the frame and having a channel to receive a cam on a pivoting handle.

The present invention provides a latch for securing a component, such as a compute node enclosure, into a component bay of a chassis or rack. Although the invention is described herein in the context of a latch adapted for being connected to a compute node, it should be recognized that the latch may be implemented to secure other hardware components into a bay of a chassis in a similar manner.

A first embodiment of the invention provides a latch comprising a frame securable to a proximal end of a compute node enclosure, and a handle pivotally secured to the frame intermediate a proximal end of the handle and a distal end of the handle so that the handle can be pivoted between a closed position and an open position, wherein the distal end of the handle has a drive pin extending therefrom. The latch also comprises a pawl having a latch key, a distal end secured to the frame, and a proximal end coupled to the drive pin.

Positioning the handle in the closed position causes the drive pin to move the proximal end of the pawl toward a side of the chassis bay and deploy the latch key beyond the frame and into engagement with a proximal end of a slot in the side of the chassis bay. Positioning the handle in the open position causes the drive pin to move the pawl away from a side of the chassis bay and withdraw the latch key out of engagement with the proximal end of the slot in the side of the chassis bay.

The handle must be in the open position during installation and removal of the compute node enclosure to and from the chassis bay. An optional keeper may be used to secure the handle in the closed position and prevent the inadvertent opening of the handle when the compute node is in the interfaced position within the bay of the component storage rack.

The pawl may be rigid, but is preferably a flexible arm with the distal end of the pawl securely attached to the frame. A flexible arm is preferably in a relaxed condition to deploy the latch key and in a flexed condition to withdraw the latch key.

A suitable flexible arm may be made with a flat metal sheet or strip. Accordingly, a slot for receiving the drive pin may be formed by bending a proximal end of the flat metal sheet back toward the distal end.

A second embodiment of the invention is a latch comprising a frame securable to a proximal end of a compute node enclosure, and a handle slidably secured to the frame, wherein the handle can slide between an inward position and an outward position, wherein the distal end of the handle has a drive pin extending therefrom. The latch further comprises a rigid pawl having a latch key, a distal end pivotally secured to the frame, and a slot that receives the drive pin.

Inserting the handle from the outward position to the inward position causes the drive pin to move within the slot, push the proximal end of the pawl toward a side of the chassis bay, and deploy the latch key beyond the frame and into engagement with a proximal end of a slot in the side of the chassis bay. Withdrawing the handle from the inward position to the outward position causes the drive pin to move within the slot, pull the proximal end of the pawl away from a side of the chassis bay, and withdraw the latch key within the frame and out of engagement with the proximal end of the slot in the side of the chassis bay.

In this second embodiment, the latch key may optionally be formed at the proximal end of the pawl. Furthermore, the proximal end of the pawl may also form a stop element that prevents the pawl from extending too far outside the frame.

Still further, the second embodiment may include a handle having a proximal end that is hinged to move between a stowed position and an extended position. In one optional aspect, the stowed position of the handle may keep the handle within the frame when the handle is also in the inward position, and wherein the extended position of the handle may allow the handle to extend beyond the frame even when the handle is in the inward position. In another optional aspect, the stowed position of the handle may prevent the handle from moving out of the inward position, or the stowed position of the handle may prevent the pawl from disengaging from the slot in the side of the chassis bay.

FIG. 1 is a perspective view of the first embodiment of the latch 10 of the present invention having a spring-like flexible pawl 61 coupled to the frame 12 and having a channel 68 to receive a drive pin 65 on a pivoting handle 20. The handle 20 is pivotally coupled to the frame 12 at a first pivot 26. The drive pin 65 is disposed on a distal end 24 of the handle 20 and is received within the channel 68 of the flexible pawl 61. The drive pin 65 will follow an arcuate path upon pivoting of the handle 20 about the first pivot 26 towards the open position, and the drive pin 65 will remain within the channel 68 while deflecting the pawl 61.

The frame 12 may include tabs 14 for securing the latch to the enclosure 50, either temporarily or permanently. The frame 12 is also shown including a keeper 40 for securing the handle 20 in a closed position. To release the keeper 40, the user would pivot the keeper away from the handle 20.

Figure 2:
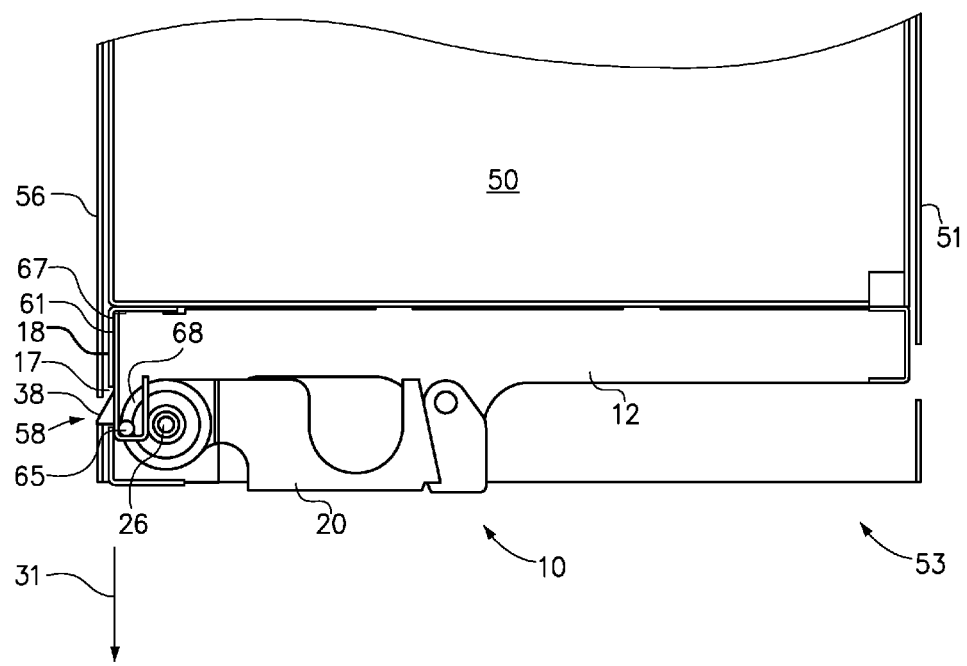
FIG. 2 is a plan view of the first embodiment of the latch revealing the latch key on the pawl received within a slot in a side rail to secure the compute node enclosure within a bay of a component storage rack.

FIG. 2 is a plan view of the first embodiment of the latch 10 of FIG. 1 revealing the latch key 38 on the pawl 61. The latch key 38 extends through a window 17 in the wall 18 to be received within a slot 58 in a side 56 of the chassis to secure the enclosure 50 within the bay 53 of a chassis 51. The latch key 38 is part of the pawl 61 and is responsible for securing the enclosure 50 within the bay 53 by preventing movement of the enclosure 50, to which the latch 10 is connected, in a proximal direction indicated by arrow 31. The pawl 61 may be coupled to the frame 12 at a retainer portion 67 of the pawl 61 to permit limited deflection of the pawl 61. By pivoting of the handle 20, the latch key 38 can be withdrawn from the slot 58 as indicated in FIG. 3.

Figure 3:
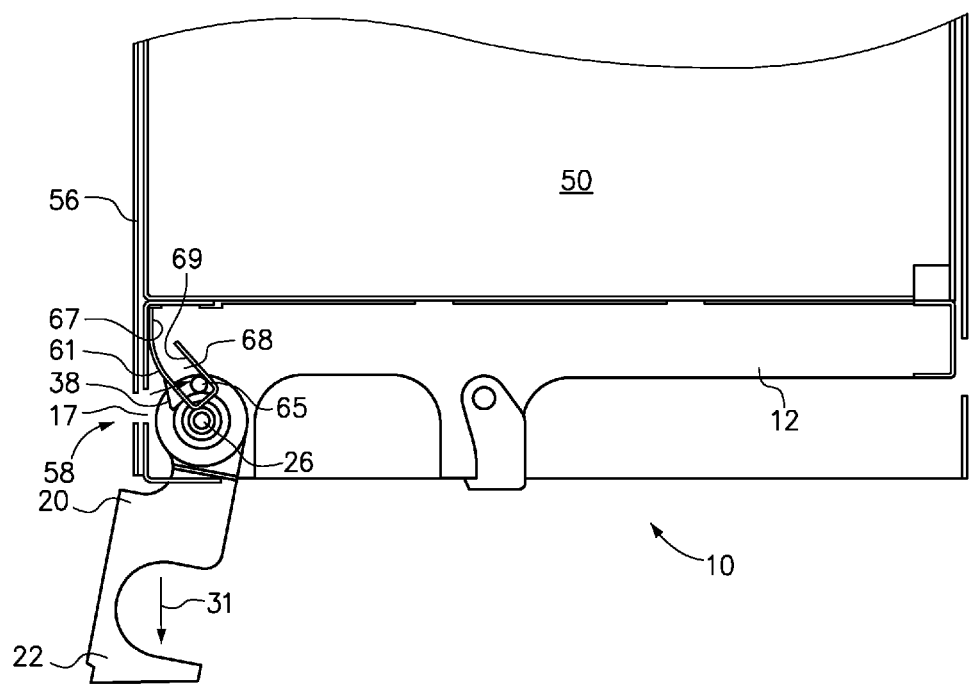
FIG. 3 is a plan view of the first embodiment of the latch after the handle is pivoted relative to the frame to deflect the spring-biased pawl to withdraw the latch key from a slot in the side rail and facilitate removal of the chassis from the bay.

FIG. 3 is the plan view of FIG. 2 after the handle 20 has pivoted relative to the frame 12 to an open position. Accordingly, the flexible pawl 61 has been deflected to withdraw the latch key 38 from the chassis slot 58 and the frame window 17 in preparation for removing the chassis 50 from the bay. The pawl 61 is deflected by engagement of the cam 65 with the side 69 of the channel 68 formed in the pawl 61 to deflect the pawl 61 and withdraw the latch key 38 from the slot 58. This releases the chassis 50 to be withdrawn from the bay, for example by pulling the proximal end 22 of the handle 20 in the direction of arrow 31.

Figure 4:
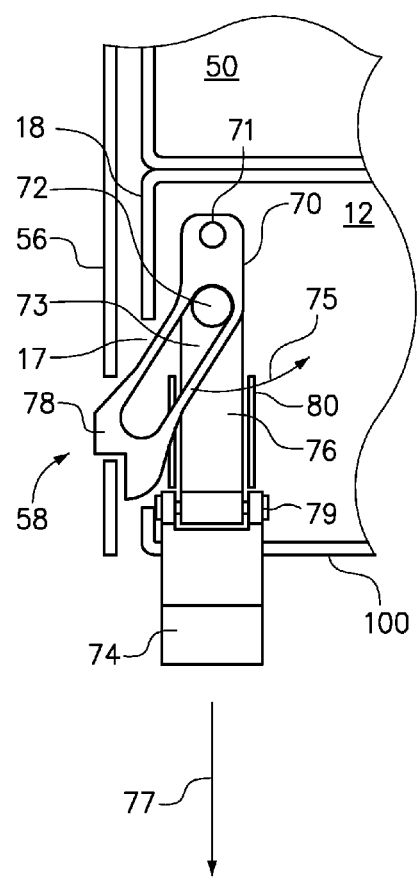
FIG. 4 is a plan view of a second embodiment of a latch of the present invention having a reciprocating handle coupled to a pivoting pawl.
Figure 5:
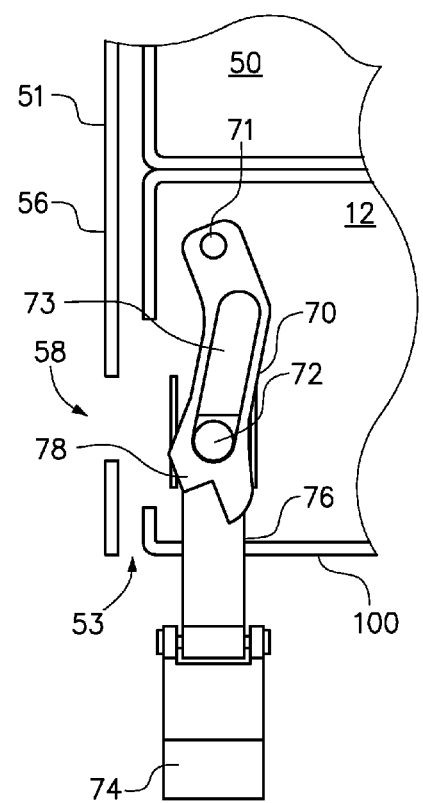
FIG. 5 is a plan view of the second embodiment of the latch after the handle is extended to pivotally disengage the latch key on the pawl from the slot in the chassis.

FIG. 4 is a perspective view of a second embodiment of a latch 100 of the present invention including a pawl 70 with a latch key 78 pivotally coupled to the frame 12 of the latch 100 to pivot between a secured position, illustrated in FIG. 4, and a released position, illustrated in FIG. 5. The pawl 70 is pivotally coupled to the frame 12 at a pawl pivot 71 and has a channel 73 to receive and cooperate with a drive pin 72 on the handle 74. The embodiment of the latch 100 includes a linearly slidable and reciprocatable handle 74 with the drive pin 72 thereon received within the channel 73 in the pawl 70. In one embodiment, the handle 76 may be slidable retained on the frame 12 by a set of guides 80 that allow slidable movement of the handle 76 relative to the frame 12.

FIG. 4 is a plan view of the latch 100 in the secured position of the pawl 70 with the latch key 78 disposed within the slot 58 in the side 56 a chassis to prevent inadvertent removal of the enclosure 50. The latch key 78 is able to extend beyond the frame 12 through a window 17 formed in the wall 18. The handle 76 of the latch 100 may include a hinge 79 that permits stowing of a proximal portion 74 of the handle 76 in a stowed position (see FIG. 6). The latch 100 operates to release the enclosure 50 from the secured position by pulling the proximal portion 74 of the handle 76 in the direction of the arrow 77 to pivot the pawl 70 about the pawl pivot 71 in the direction of arrow 75. The handle 76 slides along a linear path between a pair of rails 80.

Figure 6:
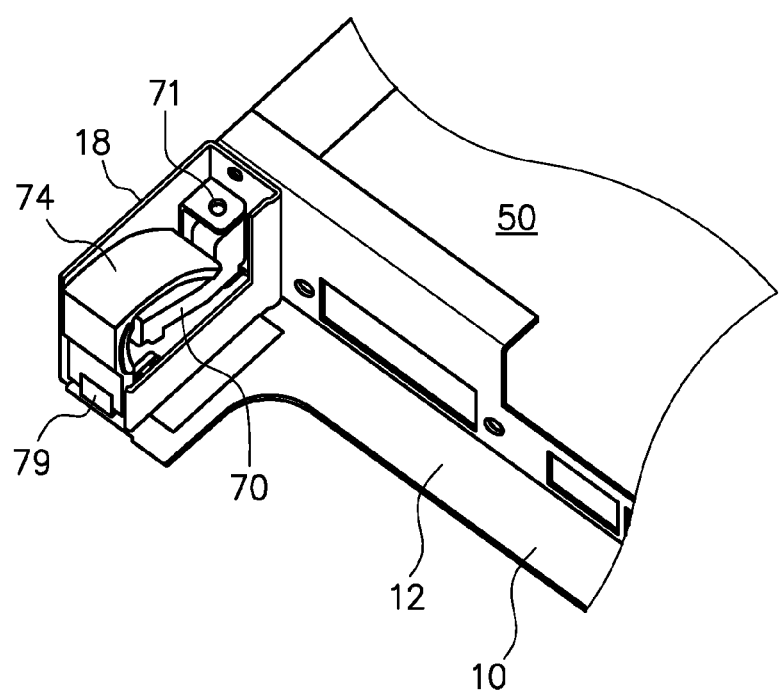
FIG. 6 is a perspective view of the second embodiment of the latch illustrating a hinged handle portion in a stowed position.

FIG. 5 is a plan view of the latch 100 of FIG. 4 after the handle 74, 76 has been pulled outwardly to pivot the pawl 70 and to disengage the latch key 78 from the slot 58 in the chassis side wall 56. The cam 72 on the handle 76 moves along and within the channel 73 of the pawl 70 to the position illustrated in FIG. 5 to pivot the pawl 70 about the pawl pivot 71 and thereby withdraw the latch key 78 from the slot 58 in the side 56 of the chassis, thereby enabling the removal of the chassis 50 from the bay 53 of the component storage rack 51. FIG. 6 is a perspective view of the latch 100 of FIG. 4 illustrating the hinged handle 74 moved about the hinge 79 to a stowed position relative to the frame 12.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A latch, comprising:
    a frame securable to a proximal end of a compute node enclosure receivable within a chassis bay having at least one slot in a side thereof;
    a handle pivotally secured to the frame by a pivot pin, the pivot pin located intermediate a proximal end of the handle and a distal end of the handle so that the handle can be pivoted about the pivot pin between a closed position and an open position, wherein the distal end of the handle has a drive pin extending therefrom;
    a flexible pawl comprising a flat metal sheet and having, a distal end secured to a first side of the frame adjacent the side of the chassis bay, and a proximal end, the proximal end comprising a latch key on a first side thereof facing the slot, and a channel on an opposing second side thereof, the channel formed by bending the proximal end of the flat metal sheet back toward the distal end, wherein the channel receives the drive pin and allows the drive pin to move within the channel, and wherein the proximal end of the flexible pawl is spring-biased toward the first side of the frame such that the latch key is normally biased into the slot in the chassis bay;
    wherein positioning of the handle in the closed position causes the drive pin to move towards the first side of the frame so as to allow the proximal end of the flexible pawl to move toward the side of a chassis bay and deploy the latch key through the slot; and
    wherein positioning of the handle in the open position causes the drive pin to move away from the first side of the frame and flex the proximal end of the flexible pawl away from the first side of the frame and withdraw the latch key from the slot.

2. The latch of claim 1, wherein the flexible pawl is in a relaxed condition to deploy the latch key and in a flexed condition to withdraw the latch key.

* * * * *